United States Patent [19]

Standke et al.

[11] 3,806,827

[45] Apr. 23, 1974

[54] FREQUENCY LOCKED OSCILLATOR SYSTEM IN WHICH INPUT AND OSCILLATOR FREQUENCIES ARE COMPARED ON HALF-CYCLE BASIS

[75] Inventors: William W. Standke, Minnetonka; Wayne L. Walters, Bloomington, both of Minn.

[73] Assignee: Honeywell, Inc., Minneapolis, Minn.

[22] Filed: July 16, 1973

[21] Appl. No.: 379,689

[52] U.S. Cl. ........................ 331/1 A, 331/8, 331/10, 331/17, 331/18, 331/27, 331/108 D, 331/111

[51] Int. Cl. ........................ H03b 3/04

[58] Field of Search ............ 331/1 A, 8, 10, 17, 18, 331/27, 25

[56] References Cited

UNITED STATES PATENTS

| | | | |
|---|---|---|---|
| 3,534,285 | 10/1970 | Kobold et al. | 331/10 |
| 3,599,110 | 8/1971 | Gindi | 331/17 X |
| 3,701,039 | 10/1972 | Lang et al. | 331/17 X |

*Primary Examiner*—Herman Karl Saalbach
*Assistant Examiner*—Siegfried H. Grimm
*Attorney, Agent, or Firm*—Lamont B. Koontz; David R. Fairbairn

[57] ABSTRACT

A frequency locked oscillator is capable of operating over several octaves without locking on harmonics. The discrepancy between the frequency of the input signal and the frequency of the oscillator signal is observed on a half cycle basis rather than on a full cycle basis as is done in conventional phase locked oscillator systems.

11 Claims, 6 Drawing Figures

TIMING DIAGRAM

FREQUENCY LOCKED OSCILLATOR SYSTEM IN WHICH INPUT AND OSCILLATOR FREQUENCIES ARE COMPARED ON HALF-CYCLE BASIS

BACKGROUND OF THE INVENTION

The present invention is concerned with oscillator systems. In particular, the present invention is concerned with a frequency locked oscillator which is capable of operation over several octaves without locking on harmonics.

Phase locked oscillators have been widely used in recent years in the communications field. In a typical phase locked oscillator system, a reference signal is produced by a voltage controlled oscillator. This reference signal is compared with the input signal by some form of phase detector. The output of the phase detector is used to either speed up or slow down the voltage controlled oscillator so that the reference signal matches the input signal.

Although a phase locked oscillator system would be highly advantageous in processing signals from fluid flowmeters, phase locked oscillators have not found application in this field. The reason is the tendency of conventional phase locked oscillators to lock on a harmonic. In other words, the phase locked oscillator may be unable to distinguish between two frequencies which are an octave apart.

The tendency to lock on harmonics is not a problem in most applications of phase locked oscillators because they are generally used to process signals of rather high frequency. For example, the octave between 10 kHz and 20 kHz is of sufficient dynamic range for many purposes. The signals from fluid flowmeters, however, are typically of very low frequency. The desired phase locked oscillator system should at least be able to process signals in the frequency range of 3 to 50 Hz and preferably in the range of 1 to 100 Hz. This is a rather large dynamic range: the frequency range of 1 to 100 Hz covers in excess of six octaves. The tendency of conventional phase locked oscillators to lock on harmonics thus precludes them from use in this application.

SUMMARY OF THE INVENTION

The frequency locked oscillator system of the present invention is capable of operation over several octaves without locking on harmonics. This feature is achieved by observing the discrepancy in frequency between the input signal and the reference signal on a half cycle basis.

The frequency locked oscillator system of the present invention comprises voltage controlled oscillator means, synchronizing means, a speed up--slow down determination means, and oscillator control means. The voltage controlled oscillator means provides a reference signal having first and second states. The frequency of the reference signal is dependent upon a control voltage. The synchronizing means restarts the voltage controlled oscillator means with the reference signal in the first state when the input signal changes from the second state to the first state. The speed up--slow down determination means produces a speed up signal if the input signal changes from the first state to the second state before the reference signal changes from the first state to the second state. If, on the other hand, the reference signal changes from the first state to the second state before the input signal changes from the first state to the second state, a slow down signal is produced by the speed up--slow down determination means. The oscillator control means adjusts the control voltage in response to the speed up and slow down signals, thus adjusting the frequency of the reference signal produced by the voltage controlled oscillator means.

DETAILED DESCRIPTION OF THE PREFERRED EMBODIMENTS

Figure 1:
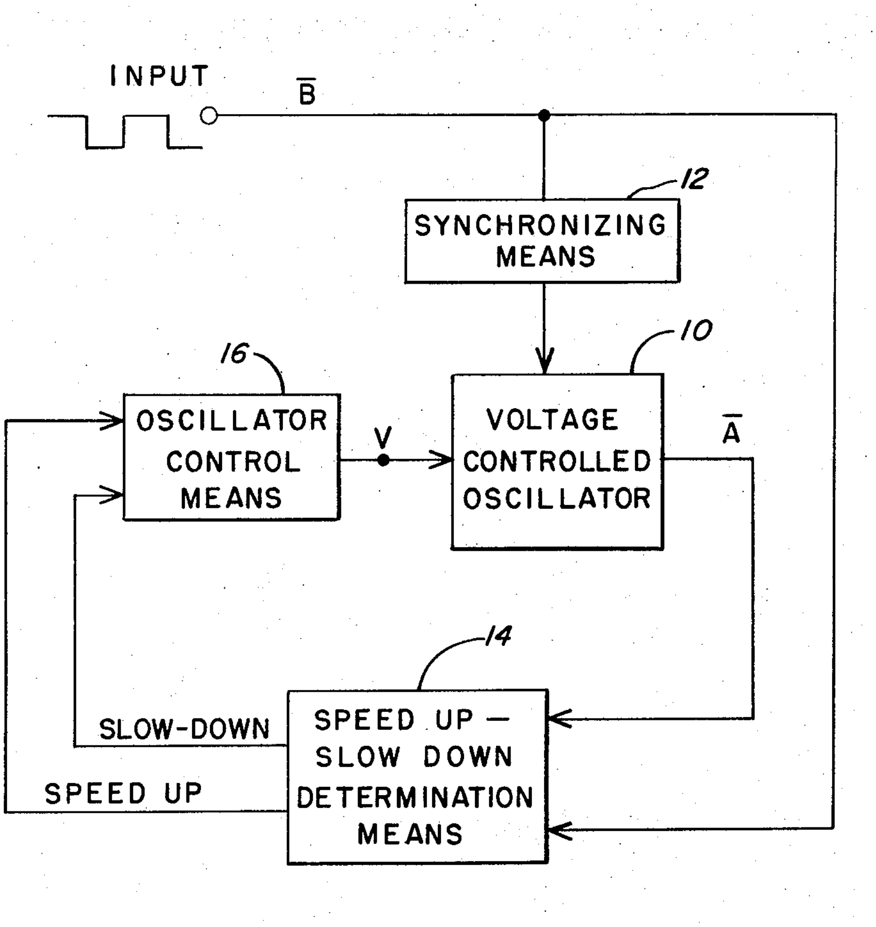
FIG. 1 shows the basic frequency locked oscillator system of the present invention.

A block diagram of the frequency locked oscillator system of the present invention is shown in FIG. 1. The system comprises voltage controlled oscillator 10, synchronizing means 12, speed up--slow down determination means 14, and oscillator control means 16. An input signal $\bar{B}$ is compared to a reference signal $\bar{A}$. From this comparison, the control voltage V is adjusted so that the frequency of reference signal $\bar{A}$ matches the frequency of input signal $\bar{B}$.

Both reference signal $\bar{A}$ and input signal $\bar{B}$ have first and second states. For the purpose of this specification, the first state has arbitrarily been termed the "0" state and the second state has been termed the "1" state.

In operation, voltage controlled oscillator 10 produces reference signal $\bar{A}$, which is directed to speed up--slow down determination means 14. The frequency of reference signal $\bar{A}$ is dependent upon control voltage V. Input signal $\bar{B}$ is received by synchronizing means 12 and speed up--slow down determination means 14. Synchronizing means 12 generates a reset signal when input signal $\bar{B}$ changes from "1" to "0." The reset signal restarts the voltage controlled oscillator 10 so that reference signal $\bar{A}$ and input signal $\bar{B}$ start at essentially the same point at the beginning of each cycle.

Speed up--slow down determination means 14 compares the frequency of input signal $\bar{B}$ and the frequency of reference signal $\bar{A}$ on a half cycle basis. Since the two signals begin each cycle in the "0" state at essentially the same time, the first signal to chanbe from "0" to "1" is the higher frequency signal. If the input signal $\bar{B}$ changes from "0" to "1" before reference signal $\bar{A}$ changes from "0" to "1," speed up--slow down determination means 14 produces a speed up signal. If, on the other hand, reference signal $\bar{A}$ changes from "0" to "1" before input signal $\bar{B}$ changes from "0" to "1," a slow down signal is produced by speed up--slow down determination means 14.

The speed up and slow down signals are received by oscillator control means 16, which adjusts control voltage V in response to the signal. In this manner, the frequency of reference signal $\bar{A}$ is adjusted to match the frequency of input signal $\bar{B}$.

Figure 2:
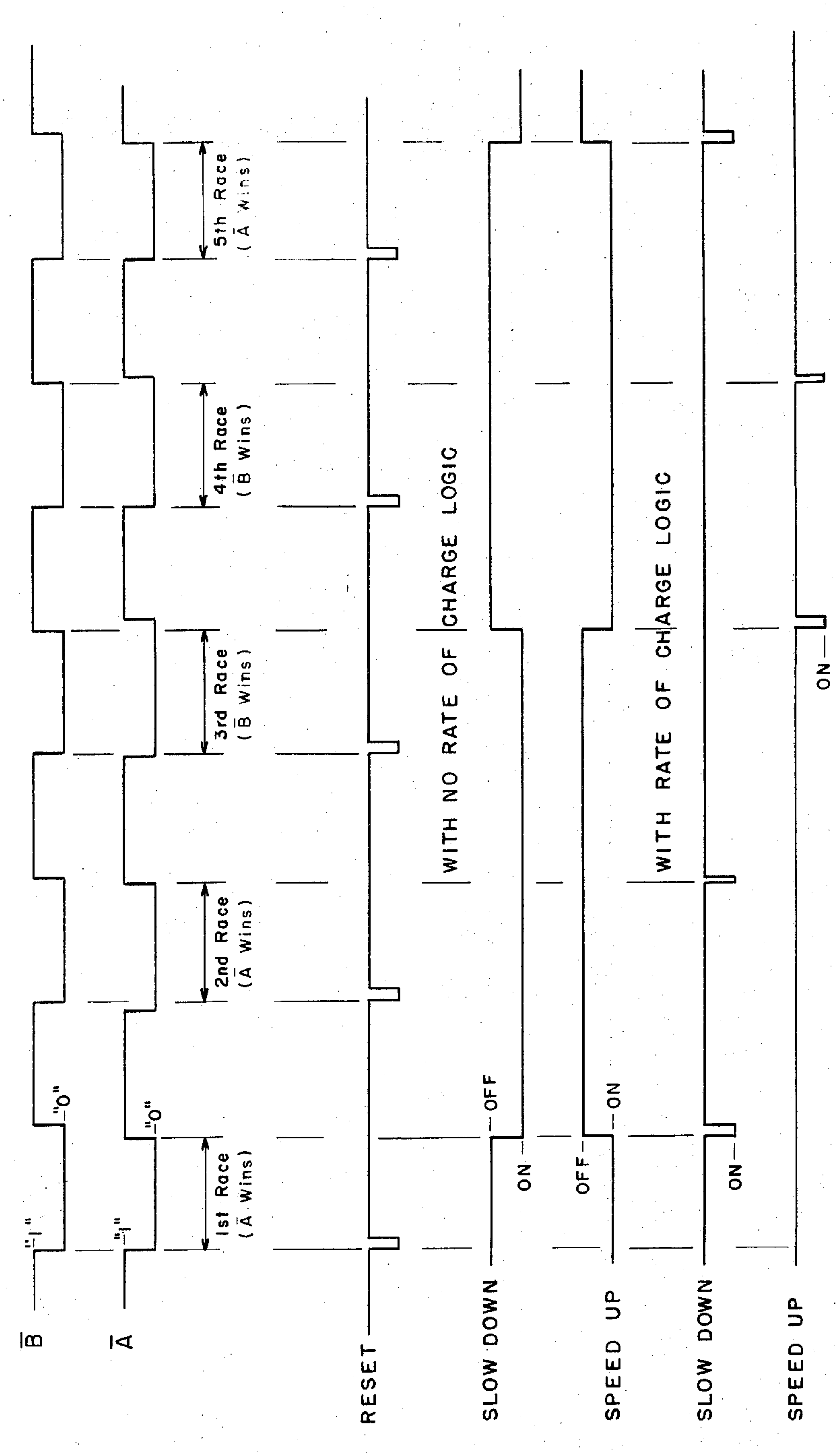
FIG. 2 shows a timing diagram of the input signal $\bar{B}$, reference signal $\bar{A}$, reset signal, slow down signal, and speed up signal for the frequency locked oscillator system of FIG. 1.

FIG. 2 shows a timing diagram for the frequency locked oscillator system of the present invention. The operation of the system may be viewed as successive races between signals $\bar{A}$ and $\bar{B}$, with the frequency of reference signal $\bar{A}$ being constantly adjusted depending upon who wins each race. As shown in FIG. 2, a reset signal in the form of a short pulse is generated each time input signal $\bar{B}$ changes from "1" to "0." This reset signal, which is generated by synchronizing means 12, resets reference signal $\bar{A}$ to "0" no matter what state reference signal $\bar{A}$ happens to be in at that instant. The reset signal also restarts voltage controlled oscillator 10 so that reference signal $\bar{A}$ and input signal $\bar{B}$ start each cycle together at "0." Whether a speed up or a slow down signal will be generated depends upon which signal, $\bar{A}$ or $\bar{B}$ wins each race.

As shown in FIG. 2, the slow down and speed up signals may take two forms, depending upon whether rate of charge logic is included in the speed up--slow down determination means 14. When no rate of charge logic is used, the slow down signal will turn on and will remain on from the instant that $\bar{A}$ first wins a race until $\bar{B}$ finally wins a race. At that instant, the speed up singal will turn on and will remain on until $\bar{A}$ finally wins a race. The control voltage V is therefore being constantly adjusted.

While the system with no rate of charge logic provides rapid response to abrupt changes in the frequency of input signal $\bar{B}$, there is a tendency to "hunt" excessively at low frequencies. If this feature is undesirable, the speed up--slow down determination means 14 may include rate of charge logic. In that case, the slow down signals are generated only from the time that $\bar{A}$ wins the race by changing from "0" to "1" until $\bar{B}$ finally changes from "0" to "1." Similarly, the speed up signals are only turned on from the time that $\bar{B}$ wins a race until $\bar{A}$ finally changes from "0" to "1." The rate of charge logic avoids excessive hunting since the speed up or slow down adjustments are only made for a time duration which is equal to the discrepancy between reference signal $\bar{A}$ and input signal $\bar{B}$. The advantage of including rate of charge logic is that speed up--slow down determination means 14 then determines not only if voltage controlled oscillator 10 is running too slow or too fast, but also how much correction is needed to synchronize signals $\bar{A}$ and $\bar{B}$. If the two frequencies are quite far apart, a large correction is applied. If they are close to synchronization, a small correction is applied.

Figure 3:
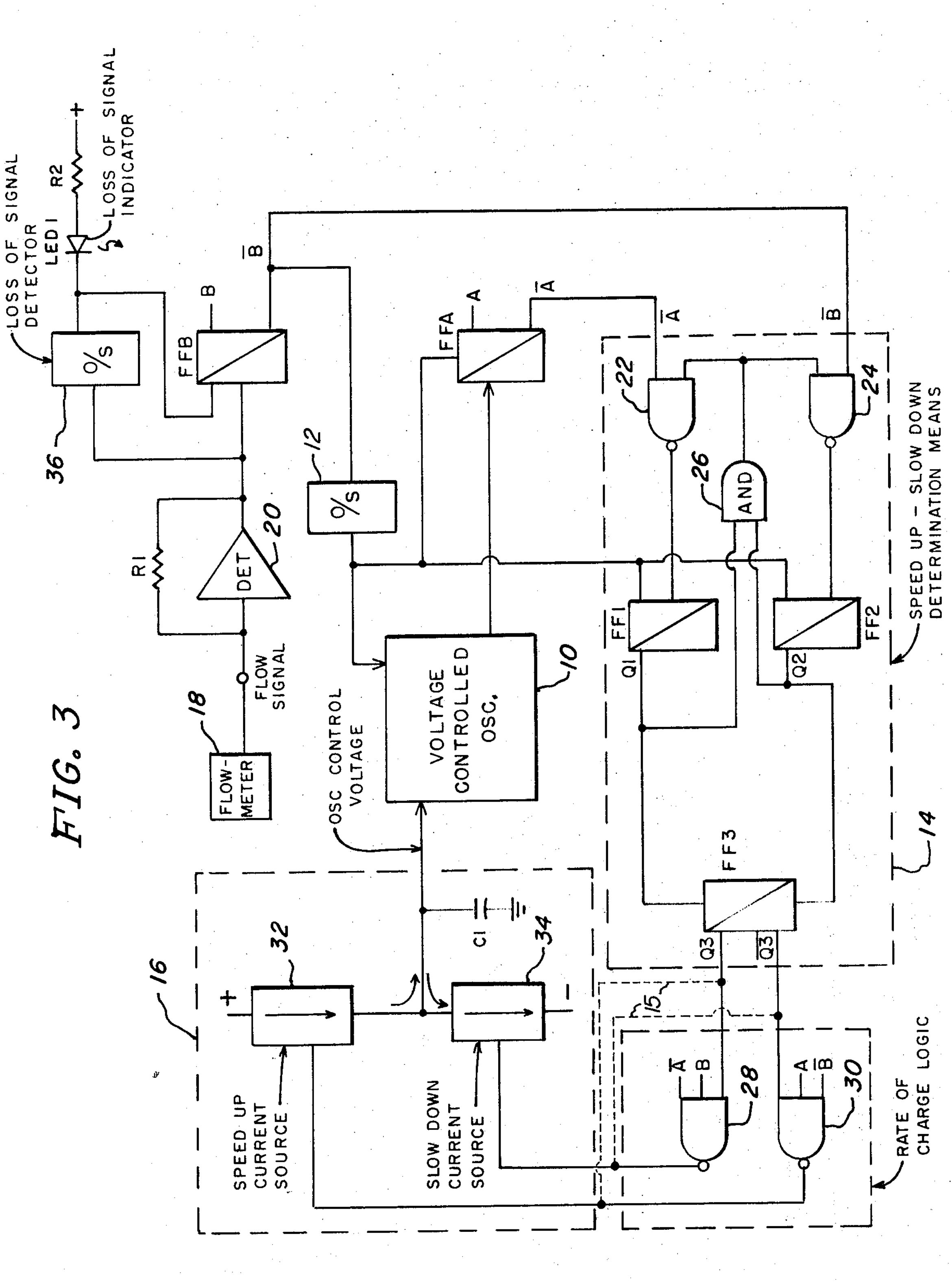
FIG. 3 shows a block diagram of one preferred frequency locked oscillator system of the present invention.

FIG. 3 shows a block diagram of a frequency locked oscillator which is useful in processing signals from a fluid flowmeter 18. The flow signal is received and squared by detector 20 and resistor R1. Flip flop FFB changes state each time the flow signal passes through zero in a positive direction. Input signal $\bar{B}$, which is generated by FFB is therefore running at one-half the frequency of the flow signal.

The output of voltage controlled oscillator 10 operates flip flop FFA. Reference signal $\bar{A}$ is one output of FFA. The other output from FFA, signal A, may be used as an AC output signal from the oscillator system.

Synchronizing means 12, which preferably is a one shot circuit, receives input signal B and generates a reset signal each time input signal $\bar{B}$ changes from "1" to "0." This reset signal restarts voltage controlled oscillator 10 and resets the outputs of flip flops FFA, FF1, and FF2 to a desired state.

Speed up-slow down determination means 14 includes flip flops FF1, FF2, and FF3 and a lock-out circuit formed by NAND gates 22 and 24 and AND gate 26. One optional feature of speed up--slow down determination means 14 is the rate of charge logic, which comprises NAND gates 28 and 30.

NAND gate 22 has reference signal $\bar{A}$ as one input, and NAND gate 24 similarly has input signal $\bar{B}$ as one input. A change in state of NAND gates 22 and 24 will cause a change of state of flip flops FF1 and FF2, respectively. AND gate 26 couples the output of flip flops FF1 and FF2 back to the other input of NAND gates 22 and 24. The purpose of this coupling is to preclude any further changes of state of FF1 and FF2 once one of them has changed state. AND gate 26 may also be thought of as a negative logic OR gate, since it produces a low output if either FF1 or FF2 is low.

Outputs Q1 of FF1 and Q2 of FF2 control the state of flip flop FF3. When no rate of charge logic is included, output $\overline{Q3}$ of FF3 is the slow down signal and output Q3 is the speed up signal. The connection of FF3 to oscillator control means 16 when no rate of charge logic is used is shown by the dotted line 15 in FIG. 3. When rate of charge logic is used, output Q3 is NANDed with signals $\bar{A}$ and B by NAND gate 28 to generate the slow down signal. Similarly, output $\overline{Q3}$ is NANDed with signals A and $\bar{B}$ by NAND gate 30 to generate the speed up signal.

Oscillator control means 16 comprises a speed up current source 32, slow down current source 34, and capacitor C1. The oscillator control voltage V is the voltage across capacitor C1. Oscillator control voltage is increased by turning on speed up current source 32, which increases the charge on capacitor C1. Oscillator control voltage V is decreased by turning on slow down current source 34, which removes charge from capacitor C1.

As discussed previously, output signal A from FFA is a digital AC output signal which is synchronized with input signal B. In many flow measurement systems, however, it is more convenient to use a DC rather than an AC output signal. A DC signal, for example, may be directly used to open or close a valve. Oscillator control voltage V, or a voltage signal proportional to oscillator control voltage V, may be used as a DC output signal since it increases linearly with increasing frequency.

When rate of charge logic is included in speed up--slow down determination means 14, an additional loss of signal detector is also included in the frequency locked oscillator system. Without the loss of signal detector, there is no signal to guarantee the state of FFB when the flow signal is turned off. Flip flop B must stop with $\bar{B}$ as "0" to guarantee that oscillator control voltage V will go to zero, thus turning off voltage control oscillator 10. As shown in FIG. 3, the loss of signal detector may be a retriggerable one shot circuit 36 which receives the flow signal from detector 20. One shot 36 has a time constant long enough that it will not time out if the signal from detector 20 is present. When the signal is no longer present, one shot 36 is allowed to time out and reset FFB so that input signal $\bar{B}$ is "0." Light emitting diode LED1 and resistor R2 are also connected to one shot 36 to give a visual indication of the loss of signal.

In order to discuss the operation of the frequency locked oscillator system of FIG. 3 in detail, the timing diagram of FIG. 2 will again be referred to. The operation of a system without rate of charge logic will first be discussed, and then the changes resulting from the addition of rate of charge logic will be discussed.

When the flow signal from flowmeter 18 comes into detector 20, it is squared and directed to FFB. When input signal $\bar{B}$ from $\overline{FFB}$ changes from "1" to "0," synchronizing one shot circuit 12 is triggered. The reset signal from synchronizing one shot circuit 12 restarts the voltage controlled oscillator 10, resets FFA so that output signal A is "1" and reference signal $\bar{A}$ is "0," and resets flip flops FF1 and FF2 so that signals Q1 and Q2 are both "1." As shown in FIG. 2, it has been assumed that the speed up signal is initially on and the slow down signal is off. This means that signal Q3 is "0" and signal $\overline{Q3}$ is "1."

Immediately after signal $\bar{B}$ has changed from "1" to "0" and the flip flops have been reset, the $\bar{A}$ and $\bar{B}$ inputs to NAND gates 22 and 24 respectively are "0." The other input to NAND gates 22 and 24 is from AND gate 26 and is "1" since Q1 and Q2 are both "1." NAND gates 22 and 24 therefore both have outputs which are "1."

In the example shown in FIG. 2, voltage controlled oscillator 10 is running too fast during the first race. Voltage controlled oscillator 10 therefore changes reference signal $\bar{A}$ from "0" to "1" before the flow signal changes input signal $\bar{B}$ from "0" to "1."

When reference signal $\bar{A}$ changes from "0" to "1," the output of NAND gate 22 changes from "1" to "0." This changes the state of FF1 from "1" to "0," which in turn changes the state of FF3 so that $\overline{Q3}$ becomes "0" and Q3 becomes "1." Speed up current source 32 is therefore turned off and slow down current source 34 is turned on.

The speed up--slow down determination means 14 also provides a lock out feature so that a sbsequent change of input signal $\bar{B}$ from "0" to "1" will not change the state of FF2 once reference signal $\bar{A}$ has won the race. This lock out feature is achieved by NAND gates 22 and 24 and AND gate 26. When output Q1 from FF1 changes from "1" to "0," the output of AND gate 26 changes from "1" to "0." This "0" at the input of NAND gate 24 insures that the output of NAND gate 24 will not change even when input signal $\bar{B}$ changes from "0" to "1." The "0" from AND gate 26 also changes the output of NAND gate 22 back to "1" and insures that the output of FF1 will not be changed again no matter what happens to reference signal $\bar{A}$. This lock out remains until input signal $\bar{B}$ again changes from a "1" to a "0" to start a new race. The reset signal from synchronizing one shot 12 resets the outputs of FF1 and FF2 to "1" and thus changes the output of AND gate 26 back to "1." Speed up--slow down determination means 14 is then ready for a new race.

As shown in FIG. 2, A also wins the second race. The operation of the system is identical to the operation described for the first race. Flip flop FF3 will not change state until input signal $\bar{B}$ finally wins a race and flip flop FF2 changes from "1" to "0."

Finally in the third race, voltage controlled oscillator 10 has been slowed down to the point where input signal $\bar{B}$ is the first to change from "0" to "1." This changes the output of NAND gate 24 to "0," which in turn changes the state of FF2. The change of Q2 from "1" to "0" reverses the state of FF3 so that Q3 becomes "0" and $\overline{Q3}$ becomes "1." Speed up current source 32 is turned on and slow down current source 34 is turned off.

Once again the lock out feature operates to preclude any further changes of flip flops FF1 and FF2. When Q2 changes from "1" to "0," the output of AND gate 26 changes from "1" to "0." This locks the output of NAND gate 22 to "1" and changes the output of NAND gate 24 back to "1."

Once $\bar{B}$ has won a race, the state of FF3 is reversed until reference signal $\bar{A}$ finally wins a race. As shown in FIG. 2, $\bar{A}$ finally wins the fifth race, thereby turning off the speed up current source 32 and turning on the slow down current source 34. It can be seen that the frequency locked oscillator system of FIG. 3 constantly is hunting back and forth to synchronize reference signal $\bar{A}$ with input signal $\bar{B}$. For the purposes of illustration, input signal B in FIG. 2 is shown as having a constant frequency. In practice, however, the frequency of input signal $\bar{B}$ often varies with time. The operation of the frequency locked oscillator system remains the same, whether input signal B is a fixed frequency or is varying in frequency.

The operation of the frequency oscillator system including rate of charge logic is essentially the same as that described above. When no rate of charge logic is included, the slow down current source is tunred on from the instant reference signal $\bar{A}$ wins a race until input signal $\bar{B}$ finally wins a race. Similarly, the speed up current source is turned on from the instant that input signal $\bar{B}$ wins a race until reference signal $\bar{A}$ finally wins a race. At low frequencies, this means that the current souces are turned on for a long time even if the discrepancy in frequency between signals A and B is slight. This leads to excessive hunting at low frequencies.

The excessive hunting problem is overcome with the rate of charge logic. The output of NAND gate 28, which is the slow down signal, is "0" only when signals $\bar{A}$, B and Q3 all are "1." Slow down current source 34, therefore, is only turned on from the instant that $\bar{A}$ wins a race until $\bar{B}$ finally changes from "0" to "1."

The output of NAND gate 30, which is the speed up signal, is "0" only when signals A, $\bar{B}$, and $\overline{Q3}$ are all "1." Speed up current source 32, therefore, is only turned on from the instant that input signal $\bar{B}$ wins a race until reference signal $\bar{A}$ finally changes from "0" to "1."

Figure 4:
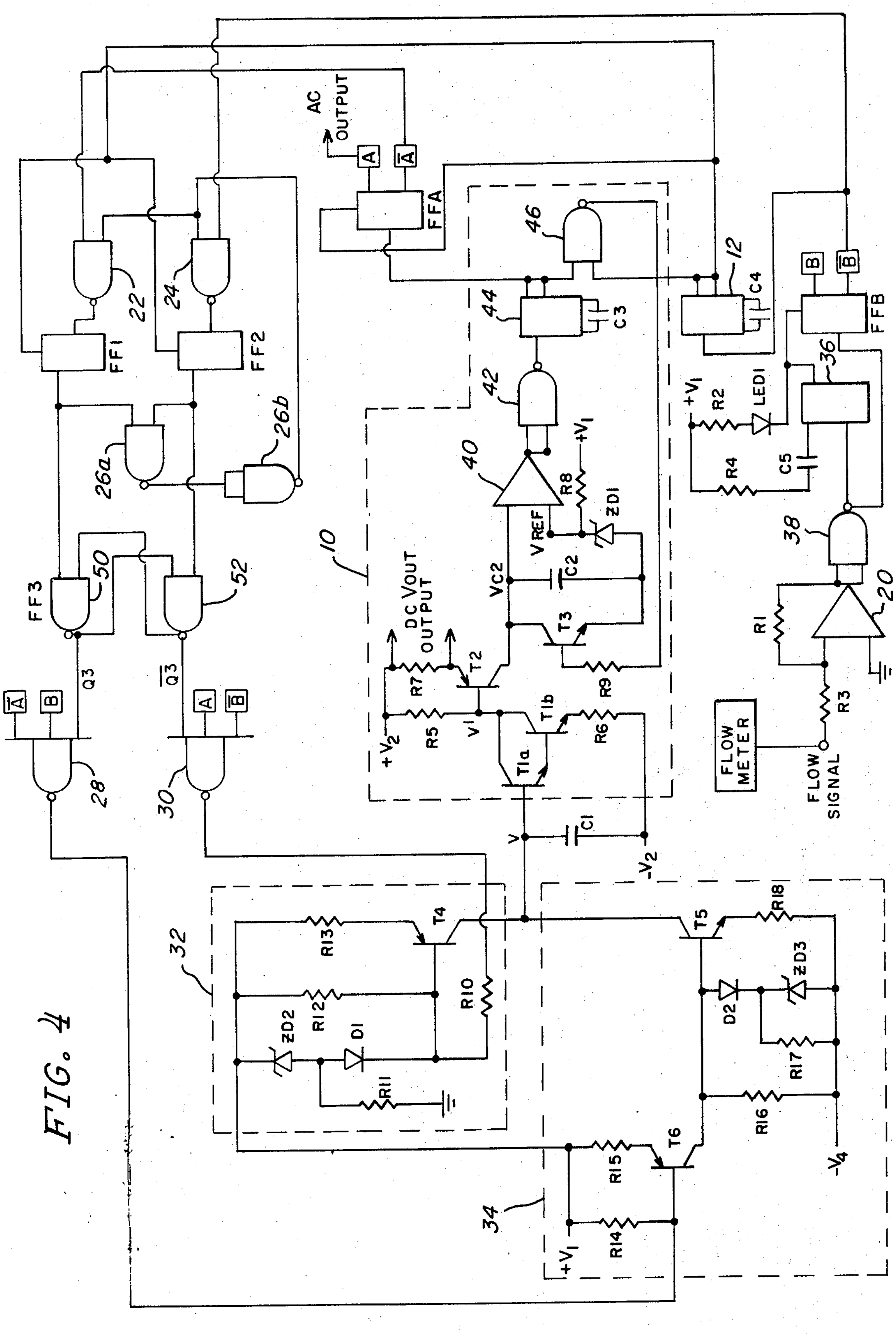
FIG. 4 schematically shows a circuit diagram of the frequency locked oscillator system of FIG. 3.

FIG. 4 shows a circuit diagram of the frequency locked oscillator system described in FIG. 3. Similar numerals have been used to designate similar elements.

Control voltage V, which is applied to the input of voltage controlled oscillator 10, is amplified by a linear amplifier consisting of darlington transistor pair T1*a* and T1*b*, resistor R5, and resistor R6. The amplified voltage V′ controls a current source consisting of resistor R7 and transistor T2. When control voltage V increases, amplified voltage V′ decreases, thus increasing the current from the current source. Conversely, when control voltage V decreases, amplified voltage V′ increases, thus reducing the current from the current source.

The current source provides current to charge capacitor C2. The rate of charging of capacitor C2 depends upon voltage V′, which controls the current source. Transistor T3 is normally turned off so that capacitor C2 is allowed to charge. Both inputs to NAND gate 46 are normally "1" so that the output of NAND gate 46 is "0." This "0" is fed back to the base of transistor T3 through resistor R9 and keeps transistor T3 turned off.

When voltage $V_{C2}$ across capacitor C2 exceeds the reference voltage $V_{ref}$, which is determined by zener diode ZD1 and resistor R8, differential comparator 40 changes state. The output of differential comparator 40 is inverted by inverter 42 and applied to one shot circuit 44. This change of state causes one shot circuit 44 to apply a short negative going pulse to NAND gate 46. The pulse from one shot 44 causes the output of NAND gate 46 to change to "1." This turns transistor T3 on, which dumps any charge on capacitor C2. As soon as the pulse from one shot circuit 44 ends, T3 is again turned off and capacitor C2 begins charging again.

The output of one shot circuit 44 also is directed to flip flop FFA. Every time a pulse from one shot circuit 44 is generated, FFA changes state.

When input signal $\overline{B}$ changes from "1" to "0," a reset signal is generated by synchronizing one shot 12. This reset signal causes the output of NAND gate 46 to change from "0" to "1." Transistor T3 is thus turned on and capacitor C2 is discharged. In this manner, the voltage controlled oscillator 10 is restarted every time input signal $\overline{B}$ changes from "1" to "0."

FIG. 4 also shows a schematic diagram of current sources 32 and 34. Speed up current source 32 consists of resistors R10, R11, R12, and R13, zener diode ZD2, diode D1, and transistor T4. When the output of NAND gate 30 goes from "1" to "0," transistor T4 is turned on. This increases the charge on capacitor C1 and raises control voltage V.

Slow down current source 34 consists of resistors R14 through R18, zener diode ZD3, diode D2, and transistors T5 and T6. Resistors R14, R15, and R16 and transistor R6 form an interface circuit to invert the signal from NAND gate 28. When the output of NAND gate 28 goes from "1" to "0," transistor T6 is turned on, thus turning on transistor T5. Slow down current source 34 thus acts as a negative current source for removing charge from capacitor C1. When slow down current source 34 is turned on, control voltage V is reduced.

In the circuit shown in FIG. 4, the components were selected for convenience. For example, AND gate 26 was formed by two NAND gates **26*a* and 26*b* acting as a NAND gate and an inverter, respectively, to perform the AND function. This was convenient since NAND gates 22, 24, 26*a*, and 26*b*** could be obtained from a single integrated circuit having four NAND gates. Skilled workers in electronics will recognize that other components may be selected depending upon cost, size, or other considerations.

The following table shows the component values and supply voltages used in one successful embodiment of the circuit shown in FIG. 4.

TABLE A

| | |
|---|---|
| Resistors | |
| R1 | 18K Ohms |
| R2 | 330 Ohms |
| R3 | 3K Ohms |
| R4 | 10K Ohms |
| R5 | 3.9K Ohms |
| R6 | 3K Ohms |
| R7 | 3.9K Ohms |
| R8 | 2K Ohms |
| R9 | 100 Ohms |
| R10 | 200 Ohms |
| R11 | 2K Ohms |
| R12 | 2K Ohms |
| R13 | 5K Ohms |
| R14 | 2K Ohms |
| R15 | 1.2K Ohms |
| R16 | 2K Ohms |
| R17 | 2K Ohms |
| R18 | 5K Ohms |
| Transistors | |
| T1*a*, T1*b* | 2N2222A |
| T2 | 2N3638 |
| T3 | 2N2222A |
| T4 | 2N3638 |
| T5 | 2N2222A |
| Capacitors | |
| C1 | 200 to 1200 μf |
| C2 | 10 μf |
| C3 | 0.3 μf |
| C4 | 0.2 μf |
| Diodes | |
| D1 | 1N536 |
| D2 | 1N536 |
| Zener Diodes | |
| ZD1 | 1N746 |
| ZD2 | 1N746 |
| ZD3 | 1N746 |
| Light Emitting Diode | |
| LED1 | Red Lit 2 Litronix |
| Integrated Circuits | |
| One shot 12 | 362 Signetics |
| One shot 36 | 74123 Signetics |
| One shot 44 | 362 Signetics |
| Differential comparator 20 | 526 Signetics |
| Inverter 38 | |
| Differential comparator 40 | 526 Signetics |
| Inverter 42 | |
| Flip flop FFA | 322 Signetics |
| Flip flop FFB | |
| Flip flop FF1 | 322 Signetics |
| Flip flop FF2 | |
| NAND gates 22, 24, 26*a*, 26*b* | 8880 Signetics |
| NAND gates 46, 50, 52 | 8880 Signetics |
| NAND gates 28, 30 | 8870 Signetics |
| Supply Voltages | |
| +V1 | +5 volts |
| +V2 | +12 volts |
| −V3 | −6 volts |
| −V4 | −12 volts |

Figure 5:
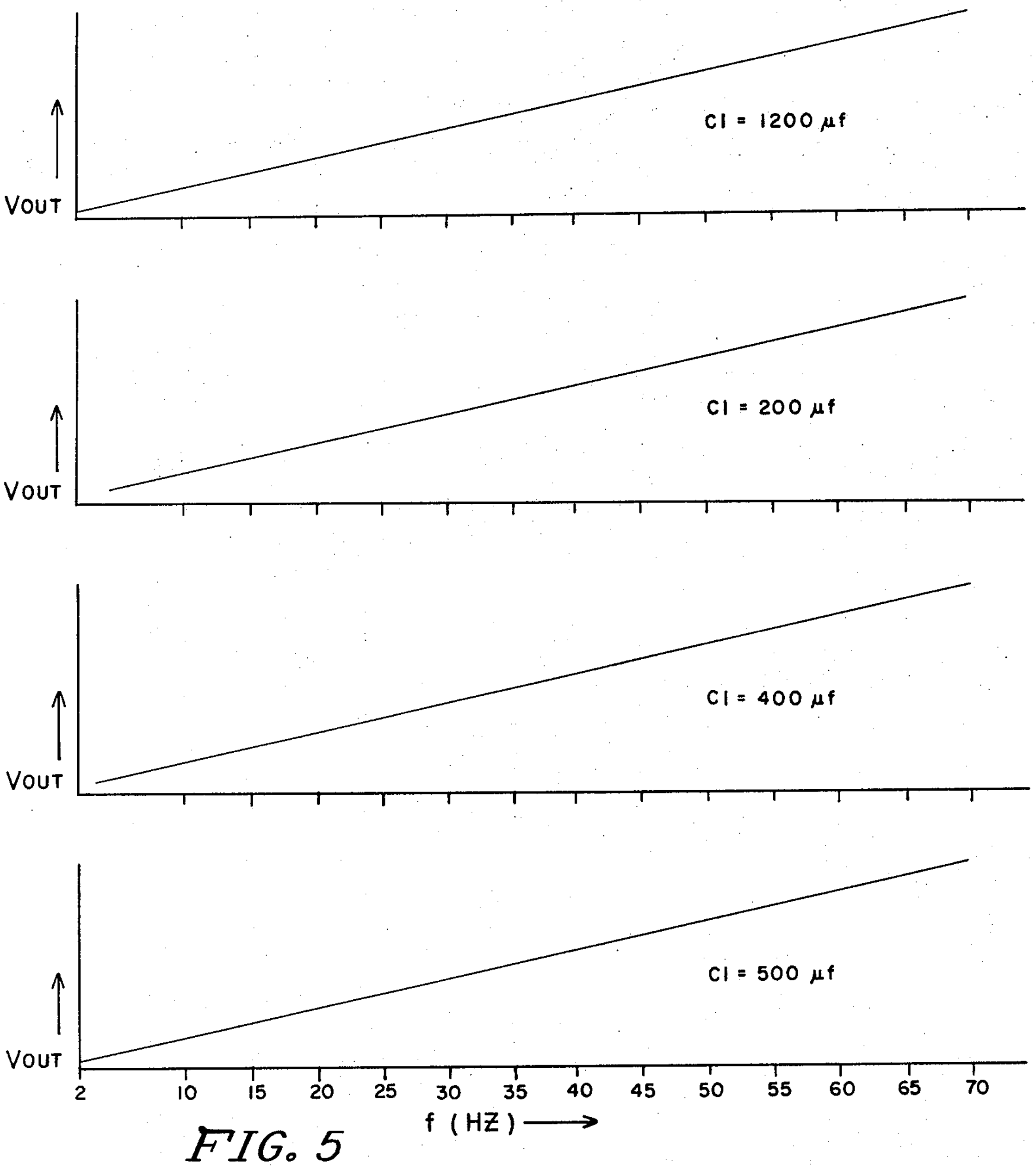
FIG. 5 shows DC output voltage as a function of frequency for the frequency locked oscillator system of FIG. 4.

As indicated in FIG. 4, the voltage $V_{out}$ across resistor R7 is proportional to control voltage V, and therefore may be used as a DC voltage output which is proportional to frequency. FIG. 5 shows $V_{out}$ as a function of frequency when four different values of capacitance for capacitor C1 were used. The values of capacitance were 200 μf, 400 μf, 500 μf, and 1,200 μf. The low frequency cutoff for the device is determined by the value of capacitor C1. When capacitor C1 was 1,200 μf, the output signal at 2 Hz was quite stable. As the capacitance was reduced to 200 μf, the lower cutoff frequency increased to about 5 Hz.

Figure 6:
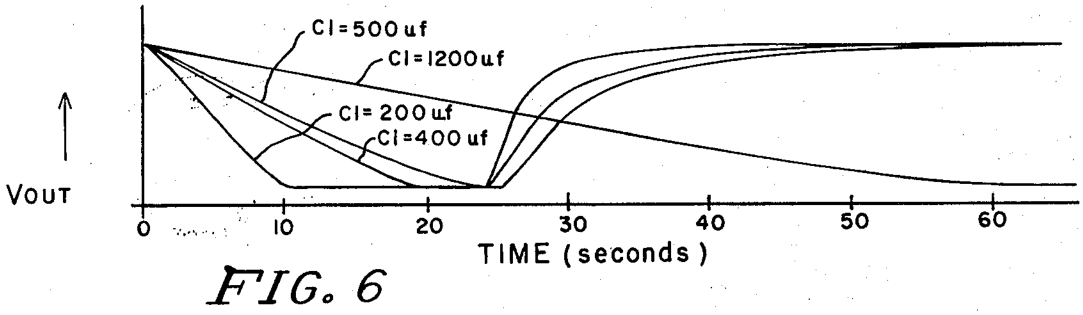
FIG. 6 shows DC output voltage response to a change in frequency from 50 Hz to 5 Hz for the frequency locked oscillator system of FIG. 4.

While extremely low frequency cutoffs can be achieved by using a large value for capacitor C1, it does increase the time required to respond to an abrupt change in input frequency. FIG. 6 shows the DC output voltage response to a change in frequency from 50 Hz to 5 Hz for each of the four capacitance values. When capacitor C1 was 1,200 μf, the response time to go from 50 Hz to 5 Hz was about 55 seconds. When the capacitance was reduced to 400 μf, the response time was cut to 20 seconds. With capacitor C1 being 200 μf, the response time was decreased to 10 seconds.

The desired value of C1 will depend upon the lower frequency cutoff and the speed of response required for a particular application. As the capacitance of C1 is increased, the low frequency cutoff is decreased but the response time for an abrupt change in frequency is increased.

The use of current sources 32 and 34 and capacitor C1 to adjust control voltage V provides a "flywheel action." In the event of intermittant loss of signal, the time constant of C1 will maintain control voltage V for a few cycles.

In conclusion, the frequency locked oscillator of the present invention is capable of operation over several octaves without locking on harmonics. This advantageous feature is achieved by observing the discrepancy between the frequency of the input signal and the frequency of the reference signal on a half cycle basis rather than on a full cycle basis as is done in conventional phase locked oscillator systems.

The present invention has been described in the form of a series of preferred embodiments. It will be understood by skilled workers in the art, however, that changes in form and detail may be made without departing from the spirit and scope of the invention.

The embodiments of the invention in which an exclusive property or right is claimed are defined as follows:

1. A frequency locked oscillator system comprising:
voltage controlled oscillator means for providing a reference signal having first and second states, the frequency of the reference signal being dependent upon a control voltage;
synchronizing means for restarting the voltage controlled oscillator means with the reference signal in the first state when an input signal changes from the second state to the first state;
speed up--slow down determination means for receiving the input signal and the reference signal and for producing a speed up signal if the input signal changes from the first state to the second state before the reference signal changes from the first state to the second state, and for providing a slow down signal if the reference signal changes from the first state to the second state before the input signal changes from the first state to the second state; and
oscillator control means for adjusting the control voltage in response to a speed up or slow down signal from the speed up--slow down determination means.

2. The frequency locked oscillator system of claim 1 wherein the speed up--slow down determination means further comprises rate of charge means for applying the speed up signal to the oscillator control means only between the time that the input signal changes from the first state to the second state and the time that the reference signal changes from the first state to the second state, and for applying the slow down signal to the oscillator control means only between the time that the reference signal changes from the first state to the second state and the time that the input signal changes from the first state to the second state.

3. The frequency locked oscillator system of claim 1 wherein the speed up--slow down determination means comprises:
first flip flop circuit for changing state when the reference signal changes from the first state to the second state;
second flip flop circuit for changing state when the input signal changes from the first state to the second state;
reset means for resetting the states of first and second flip flop circuits when the input signal changes from the second state to the first state;
lock out circuit means for precluding any change of state of one of the first and second flip flop circuits from the time the other of the first and second flip flop circuits changes state until the first and second flip flop circuits are reset by the reset means; and
third flip flop circuit for generating a slow down signal from the time the first flip flop circuit changes state until the second flip flop circuit changes state and for generating a speed up signal from the time the second flip flop circuit changes state until the first flip flop circuit changes state.

4. The frequency locked oscillator system of claim 3 wherein the reset means comprises the synchronizing means.

5. The frequency locked oscillator system of claim 3 wherein the lockout circuit means comprises:
an AND gate having first and second input terminals and an output terminal, the first input terminal being connected to the output of the first flip flop circuit and the second input terminal being connected to the output of the second flip flop circuit;
first NAND gate having first and second input terminals and an output terminal, the first input terminal being connected to receive the reference signal, the second input terminal being connected to the output terminal of the AND gate, and the output terminal being connected to the input of the first flip flop circuit; and
second NAND gate having first and second input terminals and an output terminal, the first input terminal being connected to receive the input signal, the second input terminal being connected to the output terminal of the AND gate, and the output terminal being connected to the input of the second flip flop circuit.

6. The frequency locked oscillator system of claim 3 wherein the speed up--slow down determination means further comprises rate of charge means for applying the speed up signal to the oscillator control means only between the time that the input signal changes from the first state to the second state and the time that the reference signal changes from the first to the second state, and for applying the slow down signal to the oscillator control means only between the time that the reference signal changes from the first state to the second state and the time that the input signal changes from the first state to the second state.

7. The frequency locked oscillator system of claim 6 wherein the rate of charge means comprises:
third NAND gate having first, second, and third input terminals and an output terminal, the first input terminal being connected to receive an inverse of the slow down signal from the third flip flop circuit, the second input terminal being connected to receive the reference signal, the third input terminal being connected to receive an inverse of the input signal, and the output terminal being connected to the oscillator control means; and
fourth NAND gate having first, second and third input terminals and an output terminal, the first input terminal being connected to receive an inverse of the speed up signal from the third flip flop circuit, the second input terminal being connected to receive the input signal, the third input terminal being connected to receive an inverse of the reference signal, and the output terminal being connected to the oscillator control means.

8. The frequency locked oscillator system of claim 1 wherein the oscillator control means comprises:

capacitor means having the control voltage appearing at one of its terminals;

speed up current source means connected to the capacitor means for increasing the control voltage; and slow down current source means connected to the capacitor means for reducing the control voltage.

9. The frequency locked oscillator system of claim 1 wherein the synchronizing means is a one shot circuit.

10. The frequency locked oscillator system of claim 1 and further comprising DC output means for deriving an output voltage which is proportional to the control voltage.

11. The frequency locked oscillator system of claim 1 and further comprising input signal generating means comprising:

an input terminal adapted to receive electrical signals;

detector means connected to the input terminal for squaring the electrical signals; and input flip flop circuit connected to the detector means for generating the input signal in response to the squared electrical signals from the detector means.

* * * * *